(12) United States Patent
Guritz

(10) Patent No.: US 6,226,205 B1
(45) Date of Patent: May 1, 2001

(54) REFERENCE VOLTAGE GENERATOR FOR AN INTEGRATED CIRCUIT SUCH AS A DYNAMIC RANDOM ACCESS MEMORY (DRAM)

(75) Inventor: Elmer Henry Guritz, Flower Mound, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/253,974

(22) Filed: Feb. 22, 1999

(51) Int. Cl.[7] .................................................. G11C 16/04
(52) U.S. Cl. ............................ 365/189.09; 365/189.05; 365/189.06
(58) Field of Search ........................... 365/189.09, 194, 365/226, 203, 189.06, 189.05

(56) References Cited

U.S. PATENT DOCUMENTS

| | | |
|---|---|---|
| 4,438,346 | 3/1984 | Chuang et al. . |
| 4,439,692 * | 3/1984 | Beekmans et al. .................. 307/297 |
| 5,077,518 * | 12/1991 | Han ....................................... 323/275 |
| 5,121,007 * | 6/1992 | Aizaki .................................. 307/475 |
| 5,212,440 | 5/1993 | Waller . |
| 5,255,232 | 10/1993 | Foss et al. . |
| 5,373,477 * | 12/1994 | Sugibayashi .......................... 365/226 |
| 5,498,990 * | 3/1996 | Leung et al. .......................... 327/323 |
| 5,751,639 | 5/1998 | Ohsawa . |
| 5,847,597 | 12/1998 | Ooishi et al. . |

FOREIGN PATENT DOCUMENTS 10092199   4/1998 (JP) .

OTHER PUBLICATIONS

European Search Report.

* cited by examiner

Primary Examiner—Richard Elms
Assistant Examiner—Tuan T. Nguyen
(74) Attorney, Agent, or Firm—Theodore E. Galanthay; Lisa K. Jorgenson; Dan Venglarik

(57) ABSTRACT

A reference voltage generator that may be utilized in an integrated circuit such as a dynamic random access memory (DRAM) includes a voltage divider connected to a voltage supply and a feedback buffer amplifier. The voltage divider, which determines the reference voltage, supplies at least one voltage output signal to the feedback buffer amplifier under control of a feedback control signal supplied by the feedback buffer amplifier. In at least one embodiment, the reference voltage generator further includes a delay element coupled between the voltage divider and the feedback buffer amplifier in-line with the feedback control signal and a low impedance output buffer that receives the voltage output signal from the voltage divider and supplies the reference voltage at an output node. When the reference voltage generator is implemented within a dynamic random access memory, the reference voltage is supplied to the reference plates of bit storage capacitors within the memory cells. The dielectrics of the bit storage capacitors can be further protected by including a clamping circuit within the reference voltage generator that maintains the output node at a voltage between the voltages of the two voltage supply terminals.

23 Claims, 4 Drawing Sheets

REFERENCE VOLTAGE GENERATOR FOR AN INTEGRATED CIRCUIT SUCH AS A DYNAMIC RANDOM ACCESS MEMORY (DRAM)

BACKGROUND OF THE INVENTION

1. Technical Field

The present invention relates in general to integrated circuits and in particular to a reference voltage supply for an integrated circuit. Still more particularly, the present invention relates to a low impedance, low power reference voltage supply for an integrated circuit, such as a dynamic random access memory (DRAM), having high immunity to noise coupling.

2. Description of the Related Art

A conventional dynamic random access memory (DRAM) includes an array of memory cells in which each memory cell includes a pass transistor and a capacitor. The capacitor functions as a memory element, with the presence of a charge on the capacitor representing a binary one and the absence of a charge representing a binary zero, for example. Data bits are read from and written to individual memory cells via word (row) and bit (column) lines connected to the pass transistors.

In a typical DRAM implementation, the reference plates of the memory cell capacitors are precharged to a voltage intermediate the supply voltage and ground. For example, U.S. Pat. No. 5,255,232 to Foss et al. discloses that the reference plates of storage capacitors are precharged to half of the supply voltage in order to reduce voltage stress on the thin capacitor dielectrics. When precharging the reference plates of the capacitors, it is important that the plate reference voltage be immune to noise coupling so that noise does not couple through the storage capacitors and turn on the associated pass transistors, resulting in the loss of the data bits stored by the capacitors.

SUMMARY OF THE INVENTION

The present invention improves the immunity of a low impedance, low power reference voltage generator to noise coupling through the use of feedback control. In accordance with the present invention, a reference voltage generator, which may be utilized in an integrated circuit such as a dynamic random access memory (DRAM), includes a voltage divider connected to a voltage supply and a feedback buffer amplifier. The voltage divider, which determines the reference voltage, supplies at least one voltage output signal to the feedback buffer amplifier under control of a feedback control signal supplied by the feedback buffer amplifier. In at least one embodiment, the reference voltage generator further includes a delay element coupled between the voltage divider and the feedback buffer amplifier in-line with the feedback control signal and a low impedance output buffer that receives the voltage output signal from the voltage divider and supplies the reference voltage at an output node. When the reference voltage generator is implemented within a dynamic random access memory, the reference voltage is supplied to the reference plates of bit storage capacitors within the memory cells. The dielectrics of the bit storage capacitors can be further protected by including a clamping circuit within the reference voltage generator that maintains the output node at a voltage between the voltages of the two voltage supply terminals.

All objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

Figure 1:
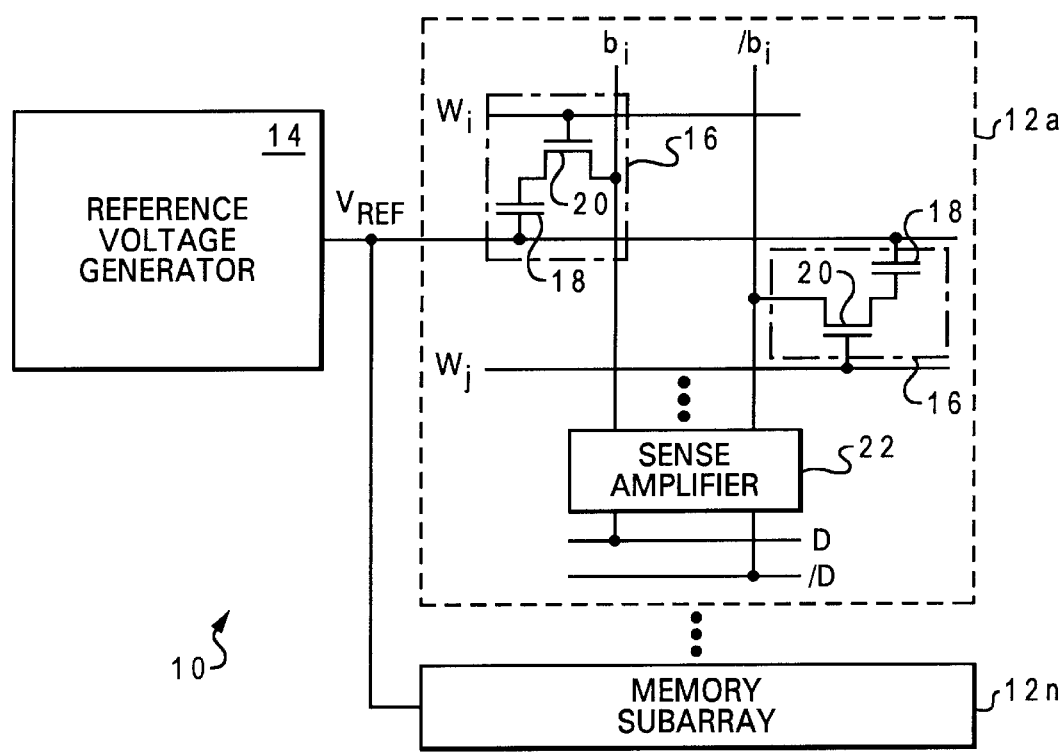
FIG. 1 is a high level block diagram of a dynamic random access memory (DRAM) with which a reference voltage generator in accordance with the present invention may advantageously be utilized.

With reference now to the figures and in particular with reference to FIG. 1, there is illustrated a high level block diagram of a dynamic random access memory (DRAM) with which a reference voltage generator in accordance with the present invention may advantageously be utilized. DRAM 10 comprises a number of memory subarrays 12a–12n, which are each connected to a reference voltage generator 14 by a reference voltage signal $V_{REF}$. As shown, memory subarray 12a, which is illustrative of the construction of the remainder of memory subarrays 12, includes a number of memory cells 16 that each contain a capacitor 18 and a pass transistor 20. As is conventional, each capacitor 18 has a reference plate that is connected to reference voltage signal $V_{REF}$ and a second plate that is connected to the source of the associated pass transistor 20. Each pass transistor 20 further includes a drain connected to a bit line (e.g., $b_i$), and a gate connected a word line (e.g., $w_i$). Capacitors 18 function as memory elements, with the presence of a charge on a capacitor 18 representing a binary one and the absence of a charge representing a binary zero, for example. Data bits are read from and written to individual memory cells 16 by asserting an appropriate word line ($w_i$, $w_j$, etc.) and by sensing or driving the appropriate complementary bit line pair (e.g., $b_i$ and $/b_i$). When performing a read access, data bits read out onto a complementary bit line pair are sensed and amplified to full rail voltage by a sense amplifier 22 and then output on complementary data bit buses D and /D.

As indicated in FIG. 2A, FIGS. 2A–2D together form a circuit schematic of an illustrative embodiment of a reference voltage generator 14 in accordance with the present invention. The illustrative embodiment of reference voltage generator 14 includes the following five subcircuits: the voltage divider and a delay element shown in FIG. 2A, the feedback buffer amplifier illustrated in FIG. 2B, the output buffer depicted in FIG. 2C, and the clamping circuit given in FIG. 2D.

Figure 2A:
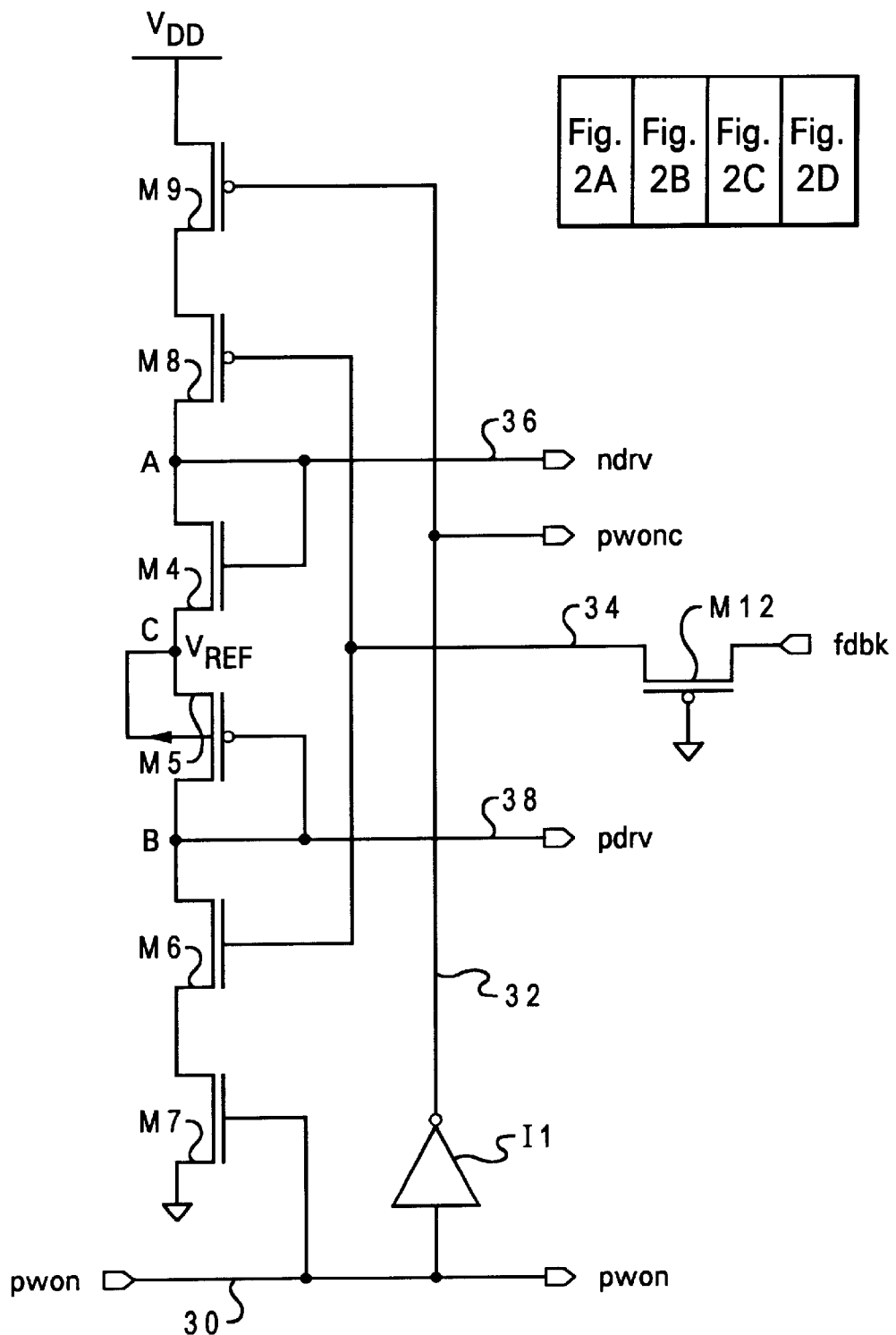
FIG. 2A depicts a voltage divider within an illustrative embodiment of a reference voltage generator in accordance with the present invention.

Referring first to FIG. 2A, the voltage divider includes a number of transistors M4–M9, which in a typical integrated circuit embodiment are implemented as Metal-Oxide-Semiconductor Field Effect Transistors (MOSFETs). As shown, transistors M4–M9, of which transistors M5, M8 and M9 are P-type and transistors M4, M6 and M7 are N-type, are connected in series between power supply voltage $V_{DD}$ and ground. N-type transistor M7 has a gate input connected to a power-on (pwon) signal 30, and P-type transistor M9 has a gate input connected to the complemented power-on (pwonc) signal 32 generated by inverter 11. As a result, transistors M7 and M9 are switched off when memory arrays 12 are placed in sleep mode and switched on when memory arrays 12 are in active mode.

As shown, transistor M8 is connected to transistor M4 at node A, which is also connected to the gate input of transistor M4 and supplies N-drive (ndrv) output signal 36. Similarly, transistor M6 is connected to transistor M5 at node B, which is also connected to the gate input of transistor M5 and supplies P drive (pdrv) output signal 38. Transistors M4 and M5 are connected at node C, which is also connected to the substrate of transistor M5. The reference voltage $V_{REF}$, which is determined by the relative sizes of transistors M6 and M8, is developed at node C when poweron (pwon) signal 30 is active. In a typical application, $V_{REF}$ is half of $V_{DD}$; however, by appropriate design of the sizes of transistors M6 and M8, $V_{REF}$ may vary approximately 0.5 V from $V_{DD}/2$ for power supply voltages of 3.0 V to 3.6 V.

Figure 2B:
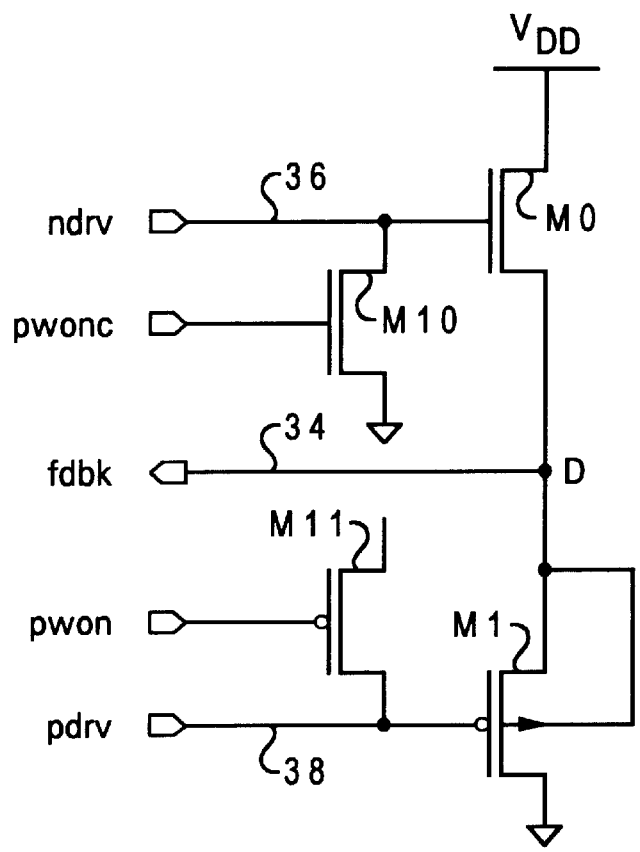
FIG. 2B illustrates a feedback buffer amplifier within an illustrative embodiment of a reference voltage generator in accordance with the present invention.

As further illustrated in FIG. 2A, the gates of transistors M8 and M6 are both connected to a feedback (fdbk) control signal 34 received from the feedback buffer amplifier depicted in FIG. 2B. Feedback control signal 34 is delayed by a delay element, such as transistor M12, in order to prevent instability in the feedback loop. Although a P-type transistor is preferred, alternative embodiments of the present invention may implement the delay element with an N-type transistor having its gate tied to $V_{DD}$ or a resistor having an impedance of 150 kΩ or greater.

With reference now to FIG. 2B, there is illustrated a feedback buffer amplifier within an illustrative embodiment of reference voltage generator 14. The feedback buffer amplifier includes an N-type transistor M0 and a P-type transistor M1 connected in series between $V_{DD}$ and ground. The gates of transistor M0 and M1 are connected to N-drive and P-drive output signals 36 and 38, respectively. Transistors M0 and M1 are connected at node D, which is also connected to the substrate of transistor M1 and supplies feedback control signal 34 to the delay element. In order to ensure a quick response to the final steady state voltages of output signals 36 and 38 following power-on, transistors M0 and M1 have small sizes, and node D is lightly loaded.

The buffer amplifier shown in FIG. 2B further includes an N-type transistor M10 connected to N-drive (ndrv) output signal 36 and a P-type transistor M11 connected to P-drive (pdrv) output signal 38. Transistors M10 and M11 turn off the gate drive voltages of transistors M0 and M1 when DRAM 10 is placed into sleep mode.

Figure 2C:
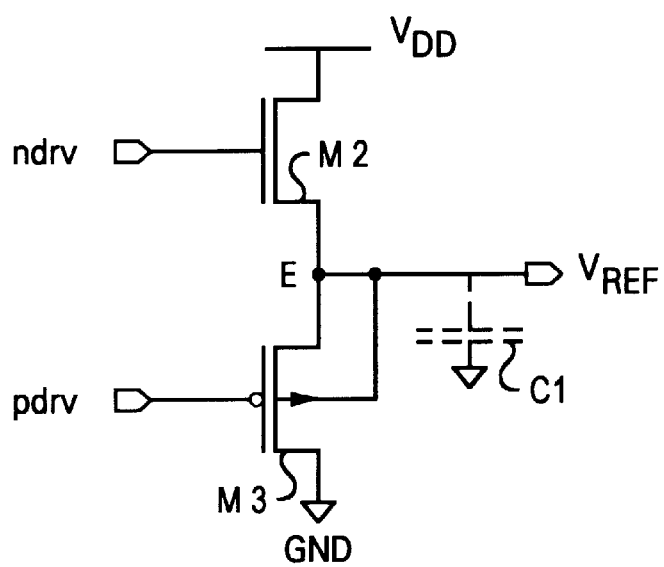
FIG. 2C depicts an output buffer within an illustrative embodiment of a reference voltage generator in accordance with the present invention.

Referring now to FIG. 2C, there is depicted a low impedance output buffer within an illustrative embodiment of a reference voltage generator 14. Reference voltage generator 14 includes one such output buffer for each respective memory subarray 12. As shown, the output buffer includes an N-type transistor M2 connected between $V_{DD}$ and node E and a P-type transistor M3 connected in series with transistor M2 between node E and ground. As indicated, node E is further connected to the substrate of transistor M3 and may optionally be connected to a capacitor C1 to provide additional output stability. In order to achieve lower impedance and provide larger current capacity, transistors M2 and M3 are preferably large devices that are each sized with the same ratio with respect to an associated one of transistors M0 and M1. For example, if transistors M0 and M1 have length-to-width ratios of 8.0/0.8 μm and 12.0/0.8 μm, respectively, transistors M2 and M3 may be four times as large, having length-to-width ratios of 32.0/0.8 μm and 48.0/0.8 μm, respectively.

Figure 2D:
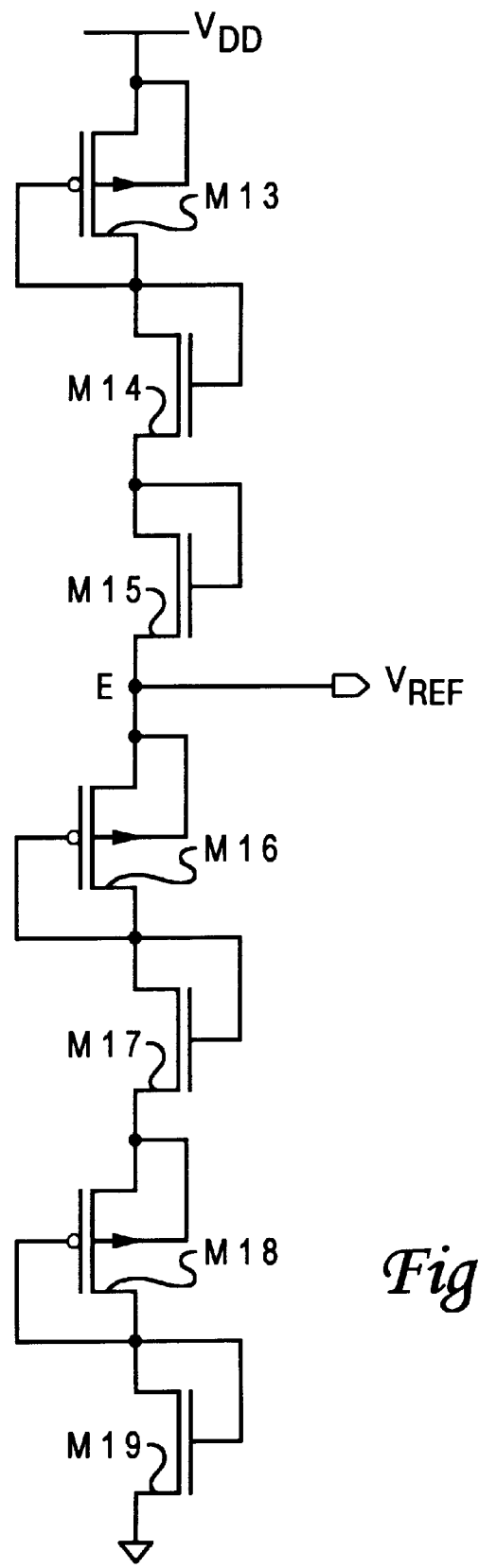
FIG. 2D illustrates a clamping circuit within an illustrative embodiment of a reference voltage generator in accordance with the present invention.

With reference now to FIG. 2D, there is illustrated a clamping circuit within an illustrative embodiment of reference voltage generator 14 that serves to maintain each $V_{REF}$ output of reference voltage generator 14 at a voltage between $V_{DD}$ and ground (e.g., between 1.3 and 1.7 V) when DRAM 10 is in sleep mode. Thus, reference voltage generator 14 preferably includes one such clamping circuit for each respective memory subarray 12 of DRAM 10.

As depicted, the exemplary embodiment of a clamping circuit includes four N-type transistors (M14, M15, M17 and M19) and three P-type transistors (M13, M16, and M18) connected in series between $V_{DD}$ and ground. Each of transistors M13–M19 is itself connected is a diode configuration, that is, with its gate connected to its source, and each of P-type transistors M13, M16, and M18 also has a substrate connection to its drain. The voltage at which $V_{REF}$ is maintained by the clamping circuit is determined by the sizes of transistors M13–M19, which in a preferred embodiment are all the same. By clamping $V_{REF}$ at a voltage intermediate $V_{DD}$ and ground when DRAM 10 is placed in sleep mode, the thin dielectric layer (e.g., $SiO_2$) of capacitors 18 within memory subarrays 12 are prevented from rupturing as a result of a voltage spike.

As been described, the present invention provides an improved reference voltage generator that may advantageously be utilized within an integrated circuit such as a DRAM. In the illustrative embodiment, the reference voltage generator includes several subcircuits, including a low-power voltage divider, a feedback delay element, a feedback buffer amplifier, a low impedance output buffer, and a protective clamping circuit. By introducing feedback control into the voltage divider, the present invention improves the immunity of the output reference voltage to noise in the power supply, while providing a quick response in response to power-on. The reference voltage generator has the further advantages of having a low-impedance output buffer that permits rapid charging of the reference plate of the memory array capacitors and a clamping circuit that protects the integrity of the capacitor dielectric during switching events.

While the invention has been particularly shown and described with reference to an illustrative embodiment, it will be understood by those skilled in the art that various changes in form and detail may be made therein without departing from the spirit and scope of the invention.

What is claimed is:

1. A reference voltage generator, comprising:
   a voltage divider connected to a voltage supply, wherein the voltage divider determines a reference voltage and supplies at least one voltage output signal under control of a feedback control signal;
   a feedback buffer amplifier connected to said at least one voltage output signal, wherein the feedback buffer amplifier includes a feedback node that is coupled to the voltage divider to supply said feedback control signal to said voltage divider; and
   an output buffer coupled to said at least one voltage output signal, wherein said output buffer includes at least two transistors connected in series at an output node providing the reference voltage, wherein said output node is electrically isolated from said feedback node.

2. The reference voltage generator of claim 1, said voltage supply having first and second voltage supply terminals, wherein said voltage divider further comprises a plurality of transistors series connected between said first and second voltage supply terminals, each of said plurality of transistors having a respective control input, said feedback control signal being connected to control inputs of at least two of said plurality of transistors.

3. The reference voltage generator of claim 2, said plurality of transistors including at least first, second, third, and fourth transistors, wherein said first transistor is coupled between said first voltage supply terminal and said second transistor and said fourth transistor is coupled between second voltage supply terminal and said third transistor, and wherein said feedback control signal is connected to a control input of each of said first transistor and said fourth transistor.

4. The reference voltage generator of claim 3, wherein said first transistor and said second transistor are coupled at a first node and said third transistor and said fourth transistor are coupled at a second node, wherein said at least one voltage output signal includes a first voltage output signal connected to said first node and a second voltage output signal connected to said second node.

5. The reference voltage generator of claim 1, and further comprising a delay element coupled between said voltage divider and the feedback node of said feedback buffer amplifier, wherein the delay element delays said feedback control signal.

6. The reference voltage generator of claim 1, wherein said output buffer has a low impedance relative to said feedback buffer amplifier.

7. The reference voltage generator of claim 1, said voltage supply including first voltage supply terminal and a second voltage supply terminal, said reference voltage generator further comprising:
a clamping circuit coupled to said output node and to said voltage supply, wherein said clamping circuit maintains said output node at a voltage between voltages of said first and second voltage supply terminals.

8. A dynamic random access memory, comprising:
a reference voltage generator as recited in claim 1; and
a memory array coupled to said output node of said reference voltage generator, wherein said memory array includes a plurality of bit storage capacitors and at least one bit line for accessing said plurality of bit storage capacitors, and wherein each of said plurality of bit storage capacitors has a reference plate to which said reference voltage is supplied by said reference voltage generator.

9. The reference voltage generator of claim 1, wherein:
said voltage supply has an higher voltage rail and a lower voltage rail;
said feedback amplifier includes an n-type transistor connected to the higher voltage rail and a p-type transistor connected in series between the lower rail and the n-type transistor; and
said p-type transistor and said n-type transistor are connected at the feedback node.

10. The reference voltage generator of claim 1, wherein:
said at least one voltage output signal comprises a first voltage output signal and a second voltage output signal; and said at least two transistors within said output buffer include a first transistor and a second transistor that each have a control input coupled to a respective one of said first voltage output signal and said second voltage output signal.

11. The reference voltage generator of claim 10, wherein the feedback buffer amplifier comprises a third transistor and a fourth transistor that each have a respective length-to-width ratio that substantially matches a length-to-width ratio of a respective one of said first and second transistors.

12. A dynamic random access memory, comprising:
a reference voltage generator, including:
a voltage divider connected to a voltage supply, wherein the voltage divider determines a reference voltage and supplies at least one voltage output signal under control of a feedback control signal;
a feedback buffer amplifier connected to said at least one voltage output signal, wherein the feedback buffer amplifier includes a feedback node that is coupled to the voltage divider to supply said feedback control signal to said voltage divider; and
an output buffer coupled to said at least one voltage output signal, wherein said output buffer includes at least two transistors connected in series at an output node providing the reference voltage, wherein said output node is electrically isolated from said feedback node; and
a memory array coupled to said output node of the reference voltage generator, wherein said memory array includes a plurality of bit storage capacitors and at least one bit line for accessing said plurality of bit storage capacitors, and wherein each of said plurality of bit storage capacitors includes a reference plate to which said reference voltage is supplied by said reference voltage generator.

13. The dynamic random access memory of claim 12, said voltage supply having first and second voltage supply terminals, wherein said voltage divider further comprises a plurality of transistors series connected between said first and second voltage supply terminals, each of said plurality of transistors having a respective control input, said feedback control signal being connected to control inputs of at least two of said plurality of transistors.

14. The dynamic random access memory of claim 13, said plurality of transistors including at least first, second, third, and fourth transistors, wherein said first transistor is coupled between said first voltage supply terminal and said second transistor and said fourth transistor is coupled between said second voltage supply terminal and said third transistor, and wherein said feedback control signal is connected to a control input of each of said first transistor and said fourth transistor.

15. The dynamic random access memory of claim 14, wherein said first transistor and said second transistor are coupled at a first node and said third transistor and said fourth transistor are coupled at a second node, wherein said at least one voltage output signal includes a first voltage output signal connected to said first node and a second voltage output signal connected to said second node.

16. The dynamic random access memory of claim 12, and further comprising a delay element coupled between said voltage divider and said feedback node of said feedback buffer amplifier, wherein the delay element delays said feedback control signal.

17. The dynamic random access memory of claim 12, wherein said output buffer has a low impedance relative to said feedback buffer amplifier.

18. The dynamic random access memory of claim 12, said voltage supply including first voltage supply terminal and a second voltage supply terminal, said reference voltage generator further comprising:

a clamping circuit coupled to said output node and to said power supply, wherein said clamping circuit maintains said output node at a voltage between voltages of said first and second voltage supply terminals.

19. The reference voltage generator of claim 12, wherein:

said voltage supply has an higher voltage rail and a lower voltage rail;

said feedback amplifier includes an n-type transistor connected to the higher voltage rail and a p-type transistor connected in series between the lower rail and the p-type transistor; and said p-type transistor and said n-type transistor are connected at the feedback node coupled to the voltage divider.

20. The dynamic random access memory of claim 12, wherein:

said at least one voltage output signal comprises a first voltage output signal and a second voltage output signal; and said at least two transistors within said output buffer include a first transistor and a second transistor that each have a control input coupled to a respective one of said first voltage output signal and said second voltage output signal.

21. The dynamic random access memory of claim 20, wherein the feedback buffer amplifier comprises a third transistor and a fourth transistor that each have a respective length-to-width ratio that substantially matches a length-to-width ratio of a respective one of said first and second transistors.

22. A dynamic random access memory, comprising:

a reference voltage generator, including:

a voltage divider connected to a voltage supply, wherein the voltage divider determines a reference voltage and supplies at least one voltage output signal under control of a feedback control signal;

a feedback buffer amplifier connected to said at least one voltage output signal, wherein the feedback buffer amplifier includes a feedback node coupled to the voltage divider to supply said feedback control signal to said voltage divider;

a delay element coupled between said voltage divider and said feedback buffer amplifier in-line with said feedback control signal;

an output buffer, connected to said at least one voltage output signal, wherein the output buffer includes at least two transistors connected in series at an output node providing the reference voltage, wherein the output node is electrically isolated from said feedback node; and a memory array including a plurality of bit storage capacitors and at least one bit line for accessing said plurality of bit storage capacitors, wherein each of said plurality of bit storage capacitors has a reference plate coupled to said output node of said output buffer.

23. The dynamic random access memory of claim 22, said voltage supply including first voltage supply terminal and a second voltage supply terminal, said reference voltage generator further comprising:

a clamping circuit coupled to said output node and to said voltage supply, wherein said clamping circuit maintains said output node at a voltage between voltages of said first and second voltage supply terminals.

* * * * *